United States Patent [19]
Bakker et al.

[11] 4,260,897
[45] Apr. 7, 1981

[54] METHOD OF AND DEVICE FOR IMPLANTING IONS IN A TARGET

[75] Inventors: Pieter Bakker, Amsterdam; Rudolf S. Kuit, Leiden; Jarig Politiek, Amsterdam, all of Netherlands

[73] Assignee: U.S. Philips Corporation, New York, N.Y.

[21] Appl. No.: 36,942

[22] Filed: May 7, 1979

[30] Foreign Application Priority Data

May 12, 1978 [NL] Netherlands ............ 7805138

[51] Int. Cl.³ .............................................. H01J 37/00
[52] U.S. Cl. ............................ 250/492 A; 250/398; 250/397
[58] Field of Search ........... 250/492 H, 492 R, 492 B, 250/396 R, 397, 398, 311, 310; 313/359, 361

[56] References Cited

U.S. PATENT DOCUMENTS

| | | | |
|---|---|---|---|
| 3,585,397 | 6/1971 | Brewer | 250/492 A |
| 3,688,389 | 9/1972 | Nakanuma et al. | 250/492 A |
| 3,864,597 | 2/1975 | Trotel | 250/492 A |
| 3,956,635 | 5/1976 | Chang | 250/492 A |
| 4,071,765 | 1/1978 | Van Oostrum et al. | 250/397 |

*Primary Examiner*—Bruce C. Anderson
*Attorney, Agent, or Firm*—Thomas A. Briody; Robert T. Mayer; Paul R. Miller

[57] ABSTRACT

In a method of implanting ions in a target, an ion beam is directed onto the target by means of an electrostatic deflection system where the beam describes a pattern over the target dependent on voltage variations on two mutually perpendicular sets of deflection plates. One of the sets of deflection plates is subjected to a varying voltage difference and the other set of deflection plates is subjected to a constant voltage difference so that the ion beam describes a straight line on the target, while at the end of the beam stroke a fixed voltage difference is superimposed on the plates having a constant voltage difference and the variation in the voltage difference is reversed in the plates having a varying voltage difference in such manner that lines described consecutively by the ion beam are always parallel and are situated at a fixed distance from each other.

8 Claims, 5 Drawing Figures

METHOD OF AND DEVICE FOR IMPLANTING IONS IN A TARGET

The invention relates to a method of implanting ions in a target in which the ions from an ion source are accelerated, are formed into a beam, are deflected by means of an electrostatic deflection system operating in two mutually perpendicular directions, and are implanted in the target. The beams describe a pattern over the target dependent on voltage variations on the two mutually perpendicular sets of deflection plates.

The invention also relates to a device for carrying out this method.

BACKGROUND OF THE INVENTION

In such a known method the target may be, for example, a semiconductor disc which is locally provided with a coating not permeable to ions and in which implanted zones are created in the places having no coating. In general the implanted doses should be as homogeneous as possible throughout the semiconductor disc.

In known methods of implanting ions the ion beam describes a pattern in the form of a zig-zag line over the target, which line extends from one side of the pattern to the other side while descending at a small angle, travels from there back to the first side while descending at the same angle, and so on. Such a beam pattern exhibits disadvantages. Near the sides of the pattern where the line returns at an acute angle, the surface with which the ion beam impinges on a semiconductor disc will overlap in the return stroke as a part of the already implanted "line". This overlap causes locally a larger implantation dose, hence inhomogeneity. Furthermore the beam will cover the whole pattern a number of times, for example in an up and down direction, so as to ultimately achieve a desired implantation dose of the target. In the known method, when a full pattern has been covered and a return pattern is described, the beam will not follow the lines of the preceding pattern, but the lines of the return pattern are slightly shifted. So these lines will locally intersect the lines of the preceding pattern and in these areas a larger implantation dose than elsewhere will also be formed, which is a further cause of inhomogeneity.

SUMMARY OF THE INVENTION

It is the object of the present invention to provide a method of implanting ions in a target in which the implanted dose is very homogeneous throughout the surface of the target and which method can nevertheless be carried out in a simple manner. In order to achieve the end in view one of the sets of deflection plates is subjected to a varying voltage difference and the other set of deflection plates is subjected to a constant voltage difference so that the ion beam describes a straight line over the target and that at the end of the beam stroke a fixed value is superimposed on the deflection plates with constant voltage difference and the variation in the voltage difference is reversed for the plates having a varying voltage difference, in such manner that lines described consecutively by the ion beam always extend parallel and are situated at a constant distance from each other.

A device for carrying out this method is characterized according to the invention in that each of the sets of deflection plates is connected to an electronic control system for adjusting the voltage difference between the deflection plates of each of the sets. The control system for a first set of deflection plates generates a varying voltage and appllies it to the deflection plates, and the control system for the other set of deflection plates supplies a constant voltage to its plates so that after the ion beam has covered a stroke across the target, the control system for the first set of deflection plates transmits a signal on to the control system for the second set of deflection plates to generate a variation of the constant voltage by a fixed amount, while simultaneously the variation of the voltage of the control system for the first set of deflection plates experiences a reversal.

In the device according to the present invention the voltages at the deflection plates can advantageously be generated digitally. A device to achieve this is characterized in that the control system for the voltage of the first and of the second set of deflection plates comprises a counter circuit, a digital-to-analog converter, a phase splitting circuit and two output amplifiers, in which the counter circuit of the control system for the first set of deflection plates receives pulses from a pulse oscillator, and passes on the summed value of the pulses to the digital-to-analog converter which provides at its output a voltage proportional to the summed value of the pulses at its input, which voltage is split in the phase splitter into a symmetrical signal with respect to earth potential and is applied to the deflection plates by the voltage amplifiers. The control system at the end of the stroke of the beam applies a voltage pulse to the counter circuit of the control system for the second set of deflection plates so that in the associated digital-to-analog converter the applied voltage is influenced by one step and thus varies the voltage at the associated deflection plates by a fixed amount. A count up/count down input in the counter circuit of the first control system is simultaneously influenced so that the oscillator pulses are counted in the opposite sense.

In this case a simple and reliable control of the ion beam is obtained which is also suitable for automation. If desired the possibility is also present for implanting the target with a varying dose, namely by varying the frequency of the pulse oscillator so that the velocity at which the beam moves over the target is varied. Furthermore a bias voltage may be applied to set inputs which are present on the counter circuit so that a presetting is added to the summed value of the pulses, which has for its result that the pattern to be described on the target can be adjusted at will.

The device according to the invention can be provided in a simple manner with means which ensure that the ion beam after leaving the target starts to describe as rapidly as possible a subsequent stroke in the opposite direction and thus the implantation time does not become unnecessarily large. For this purpose, a rod of electrically conductive material is provided on oppositely located sides of a connection place for the target, which rods are each connected, by a resistor, to a fixed potential, for example earth potential, and are furthermore connected to the two control systems for the voltage at the deflection plates. If a voltage pulse is formed across a resistor when the ion beam impinges on a rod, the counter circuit of the control system for the deflection plates having a constant voltage receives a pulse which results in the variation by a fixed amount of the voltage at the associated deflection plates, and the count-up/count-down input of the counter circuit of the control system for the deflection plates having a different voltage experiences an influence so that the counter circuit starts counting the applied oscillator pulses in the opposite sense.

Ion implantation is frequently used on semi-conductors discs. Such discs are circular. When describing a usual rectangular pattern, the ion beam will be beside the semiconductor disc for a relatively long time. In order to remove this disadvantage, in a further embodiment in accordance with the invention the rods consist of two arcuate strips which are provided around a circular target.

The voltage pulses which are formed across the resistors may also be used to visualize an indication of the position of the beam. Further rods or arcuate strips may advantageously be provided near the connection place for the target and each be connected, by a resistor, to a fixed potential, for example earth potential, and furthermore each may be connected to a light indicator.

The invention will be described in greater detail with reference to the drawing. In the drawing

BRIEF DESCRIPTION OF THE INVENTION

DETAIL DESCRIPTION OF THE INVENTION

Figure 1:
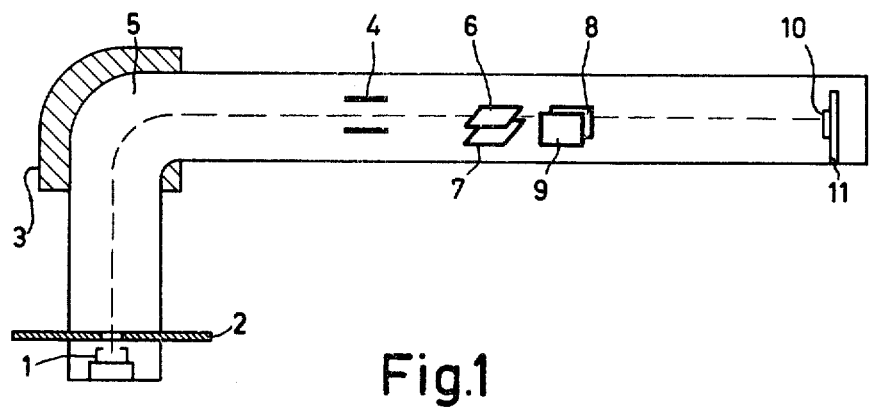
FIG. 1 shows diagrammatically an ion implantation machine.

FIG. 1 shows diagrammatically an ion implantation machine. Ions from an ion source 1 are accelerated by means of an electric field. This field is formed by a voltage difference between the ion source 1 and accelerating electrode 2, which voltage difference may be, for example, 100 kV. The formed ion beam traverses a magnetic field the strength of which has been adjusted by means of a deflection magnet 3 in such manner that only desired ions describe a curve 5. Particles having a larger or smaller mass than the desired mass will impinge against the outside and inside curve walls, respectively. The ions which have traversed the curve 5 are focused by means of a system of lenses 4 onto a target 10 which is secured to a support 11. The target 10 is, for example, a semiconductor disc which is implanted with ions to obtain one or more zones of the desired conductivity type. For that purpose the ion beam must describe a pattern over the semiconductor disc 10.

The control of the ion beam takes place by means of an electrostatic deflection system. For this purpose deflection plates 6, 7 and 8,9 are present for deflecting the beam in two mutually perpendicular directions. By controlling a differential voltage between the deflection plates 6, 7 and 8,9 respectively, which differential voltage can be controlled, for example, to a maximum of 10 kV, the ion beam is deflected so that the semiconductor disc 10 is hit according to a desired pattern. The principle of the operation of such an ion implantation machine is known per se and needs no further description.

Figure 2:
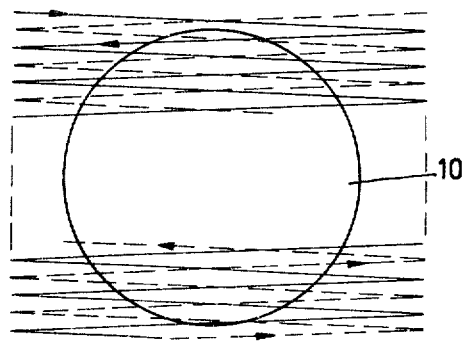
FIG. 2 shows a usual pattern which the ion beam describes over the target.

Frequently zones must be implanted with ions over the whole semiconductor disc as homogeneously as possible. FIG. 2 shows a diagrammatic example of a pattern in which the beam impinges on the semiconductor disc in known devices. In the electrostatic deflection system used a triangular voltage is generated by a voltage generator. This voltage is split into a symmetrical signal with respect to earth, amplified and applied to the deflection plates. This is done both for the deflection plates 6, 7 which deflect the beam in the X-direction and for the deflection plates 8, 9 which can produce a beam displacement in the Y-direction. By controlling the value of the voltage on the X- and Y-deflection plates, the beam can be incident on the semiconductor disc according to the reciprocating line shown in FIG. 2 in which a rectangular field is described.

Figure 3:
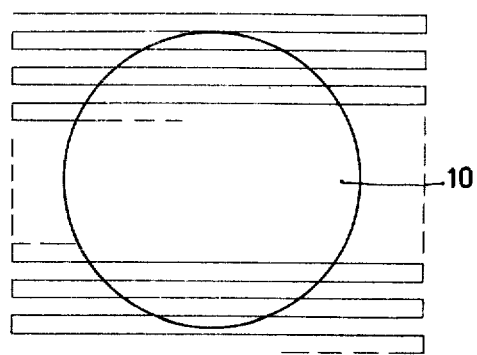
FIG. 3 shows a pattern which the beam describes over the target when using the invention.

FIG. 3 shows an implantation pattern according to the invention. In the zig-zag pattern shown in FIG. 2 inhomogeneity may result inter alia in the proximity of the reversal points of the beam in that the reciprocating beams which are incident on the semiconductor disc as an area of, for example, circular or elliptical shape, partly overlap each other. Also, when a pattern has been fully covered and a subsequent pattern is described in the opposite direction, lines of the patterns will intersect each other, an overdosage being formed at the points of intersection. In the pattern shown in FIG. 3 these defects can be prevented. The pattern of FIG. 3 is obtained by causing the beam to be deflected under the influence of an electric field of varying strength, for example for the X-direction, and of a constant field for the Y-direction. At the end of each stroke of the beam in the X-direction the static field between the Y-deflection plates is varied by a small amount so that the beam covers a smaller distance in the Y-direction. The beam is then moved again in the X-direction, the field between the Y-deflection plates remaining constant. The required voltages at the deflection plates can advantageously be generated digitally.

Figure 4:
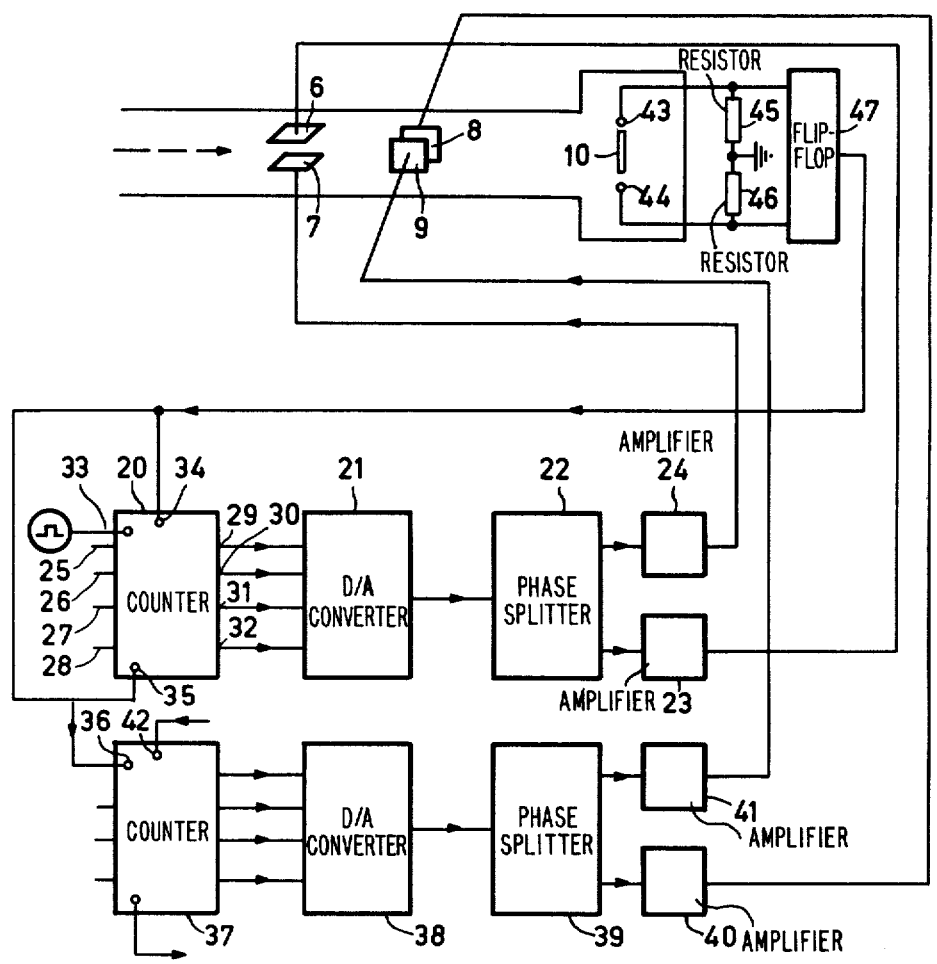
FIG. 4 shows an electronic digital control system to obtain the pattern shown in FIG. 3.

FIG. 4 shows an example of generating the deflection voltages digitally. An identical channel has been used both for the voltage at the X-deflection plates and for that at the Y-deflection plates. For the explanation of the operation, mainly the channel for generating the deflection voltage in the X-direction will be described. In this embodiment the channel comprises a counter circuit 22 operating according to the binary system, a digital-to-analog converter 21, a phase splitter 22 and two parallel output amplifiers 23 and 24 which are connected in opposite phases and are connected to the deflection plates 6 and 7, respectively. Each of the circuits consists of known electronic components.

The counter circuit 20 has a number of set inputs of which for simplicity four, 25, 26, 27, 28, are shown, as well as the same number of outputs, 29, 30, 31, 32. A presetting can be given to the counter circuit 20 by means of the set inputs. The counter circuit furthermore comprises a clock input 33 to which voltage pulses originating from an oscillator are applied, and a count-up/count-down input 34 which causes the voltage pulses of the clock input to be counted up or counted down. The combination of the outputs 29–32 binarily represents the sum of the voltage pulses, in which the adjustment of each output can be represented as a "0" or "1". With each further pulse there is counted binarily so that the setting varies at least on one of the outputs. The set of the outputs is passed on to the digital-to-analog converter 21 the output voltage of which is proportional to the binary value at the input. The voltage present at the output of converter 21 is applied to phase splitter 22 and then to the parallel output amplifiers 23 and 24 connected in opposite phases. Amplifier 23 applies the voltage to deflection plate 6 while amplifier 24 applies an equally large voltage of opposite sign to deflection plate 7.

The voltage pulses applied to the clock input 33 are summed by the counter circuit so that the voltage at the output of the converter 21 varies and consequently the voltage at the deflection plates 6 and 7 varies. Therefore, the ion beam is deflected in the X-direction. If all the outputs 29-32 have a setting represented by "1", the beam is deflected maximally and will be beside the semiconductor disc 10. A maximum/minimum output 35 present in the counter circuit 20 then generates a voltage variation which is applied to the clock input 36 for the counter circuit 37 of the Y-channel. This pulse is summed in the Y-counter 37 to the value present at the outputs of the counter; the digital-to-analog converter 38 for the Y-channel experiences a voltage variation by a step jump which produces a variation of the voltage on the Y-deflection plates by one step by the phase splitter 39 and the output amplifiers 40, 41. The beam thus moves one step in the Y-direction. A digital circuit ensures that a "0" is presented to the count-up/count-down input 34 of the X-counter circuit 20 so that the X-counter starts counting down. The beam now moves over the semiconductor disc in the opposite direction. When all the outputs 29-32 of the X-counter 20 have arrived in the "0" setting, the beam is on the other side of the semiconductor disc. The maximum/minimum output 35 again generates a voltage variation so that the beam is moved again in the Y-direction by one step. When the Y- counter has reached the maximum position, so its outputs have a "1" set, the polarity of the Y-count-up/count-down input 42 is varied after which the beam describes the pattern of FIG. 3 in the opposite direction. The operations are repeated until the desired implantation dose has been obtained.

The use of the digital voltage control described for the deflection plates has still further advantages. By varying the frequency of the pulses which are applied at the clock input 33 of the counter 20, the ion beam moves faster or slower over the semiconductor disc with which the possibility of varying the implantation dose can be obtained in a simple manner. Furthermore, by giving the set inputs of the counters 20, 37 a presetting, the summed value at the outputs of said counters can be influenced so that any desired shape can be given to the pattern to be described.

The stroke of the ion beam should preferably not be much larger than the dimension of the target in order that the implantation time is not unnecessarily lengthened. The control system described is excellently suitable to avoid an excessively large stroke length of the ion beam with auxiliary means which are simple to provide. For this purpose straight rods or wires 43 and 44 are provided beside the target and are connected by resistors 45 and 46, respectively, to a fixed potential, for example earth potential. If, for example the ion beam is incident on rod 43, a voltage pulse will be formed across resistor 45 and be applied to a set-reset flip-flop circuit 47. This flip-flop circuit passes a voltage to the count-up/count-down input 34 of counter 20 so that the counter starts counting the pulses at the clock input 33 in the reverse sense and also passes a pulse onto clock input 36 of counter 37 so that the voltage at the Y-deflection plates is varied by a fixed amount. So the ion beam will describe a further line in the opposite direction across the target 10. If the beam then is incident on the rod 44, it is inverted in the same manner and again describes a subsequent line. For the reversal of the beam in the Y-direction similar reversal rods may also be provided.

When implanting semiconductor discs which are circular, the beam during describing the pattern shown in FIG. 3 will nevertheless be beyond the semiconductor disc at least 20% of the time. In order to further reduce the implantation time of the semiconductor disc, in a favourable embodiment of the invention two arcuate strips in the form of semicircular electrically conductive strips 48, 49 are provided around the semiconductor disc, see FIG. 5. These strips are again connected by resistors 50, 51 to a set-reset flip-flop circuit the output of which are passed in a similar manner as in FIG. 4 to the control systems of the voltages at the deflection plates. The operation of these reversal segments is equal to that of the wires 43, 44. Sensors 53 and 54, respectively, which are connected to a fixed potential, for example earth, by resistors 55, 56, respectively may be coupled by a flip-flop circuit, to the count-up/count-down input 42 of the counter for the control system for the voltage at the Y-deflection plate so that the reversal in the Y-direction is produced.

Figure 5:
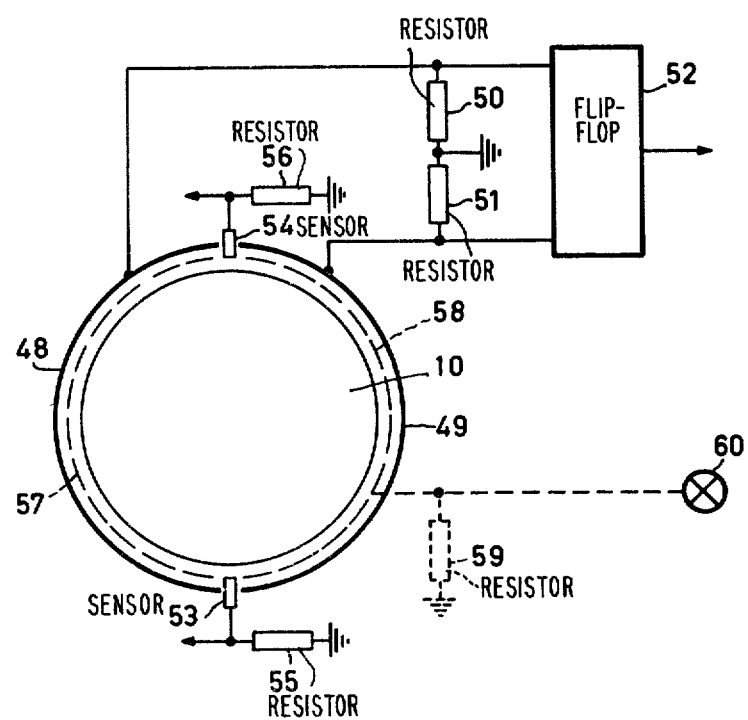
FIG. 5 shows arcuate strips operating as inverter elements for the beam.

The rods 43, 44 and the semicircular strips 48, 49, may furthermore serve as a control for a light indicator which visualizes the position of the beam. In order to indicate said position more extensively, furthermore several rods, circular elements or sensors may be used. In FIG. 5, a set of indicator strips 57, 58 is denoted by a broken line by way of example. These segments are also connected, by a resistor, to a fixed potential, for example earth, and also to a light indicator, for example a lamp, a neon tube or a light-emissive diode. FIG. 5 shows diagrammatically only the operation of one of the strips. When the beam is incident on strips 58, a voltage will be formed across resistor 59, which voltage is used to cause the indicator 60 to light up. By connecting a number of strips to light indicators and arranging the indicators in a pattern corresponding to the mutual position of the segments, the path which the beam covers can be observed.

What is claimed is:

1. A device for implanting ions in a target comprising an ion source; means for accelerating ions and forming said ions into an ion beam; means including two mutually perpendicular sets of deflection plates connected to voltage sources for deflecting said ion beam to a target; and control means connected to each of said sets of deflection plates for adjusting voltage differences between said deflection plates, said control means providing a varying voltage to a first set of said deflection plates and a constant voltage to a second set of said deflection plates, wherein after said ion beam has completed a stroke across said target said control means transmits a signal to said second set of deflection plates for generating a variation of said constant voltage by a fixed amount, and simultaneously reverses said varying voltage applied to said first set of deflection plates, CHARACTERIZED IN THAT for each of said first and second sets of deflection plates said control means comprises a counter, a digital-to-analog converter, a phase splitter, and two output amplifiers, wherein said counter for said first set of deflection plates receives pulses from a pulse oscillator, and passes a summed value of said pulses to said digital-to-analog converter for said first set of deflection plates; wherein said digital-to-analog converter provides an output voltage proportional to said summed value of said pulses; wherein said outut voltage is split by said phase splitter into symmetrical signals with respect to ground, and is applied by said output amplifiers to said first set of deflection plates; wherein at the end of said stroke of said ion beam, said control means applies a voltage pulse to said counter of said second set of deflection plates so that in said digital-to-analog converter of said second set of deflection plates the applied voltage is influenced by one step to vary voltage at said second set of deflection plates by said fixed amount; and wherein input of said counter of said first set of deflection plates is simultaneously influenced so that said pulses are counted in an opposite sense.

2. A device according to claim 1, wherein electrically conductive elements are provided at least at oppositely located sides of said target, said elements being connected by a resistor to a fixed potential, and being connected to said control means; and wherein incidence of said ion beam on one of said elements creates a voltage pulse for varying said constant voltage by said fixed amount, and simultaneously reversing said voltage pulses applied to said counter of said first set of deflection plates.

3. A device according to claim 2, wherein said elements include wire rods.

4. A device according to claim 2, wherein said elements include two arcuate strips provided around a circular target.

5. A device according to claims 2, 3, or 4, wherein further elements are provided near said target connections, and wherein said further elements are connected by a resistor to a fixed potential, and are connected to a light indicator.

6. A device according to claim 5, wherein said fixed potential is ground potential.

7. A device according to claim 2, wherein said fixed potential is ground potential.

8. A device according to claim 1, wherein said pulses from said pulse oscillator are varied in frequency.

* * * * *